US012749833B2

(12) United States Patent
Park et al.

(10) Patent No.: US 12,749,833 B2
(45) Date of Patent: Sep. 29, 2026

(54) PORT CAGE RETENTION

(71) Applicant: Arista Networks, Inc., Santa Clara, CA (US)

(72) Inventors: Youngbae Park, Milpitas, CA (US); Robert Morris Wilcox, Saratoga, CA (US)

(73) Assignee: Arista Networks, Inc., Santa Clara, CA (US)

( * ) Notice: Subject to any disclaimer, the term of this patent is extended or adjusted under 35 U.S.C. 154(b) by 268 days.

(21) Appl. No.: 18/534,070

(22) Filed: Dec. 8, 2023

(65) Prior Publication Data

US 2025/0192460 A1 Jun. 12, 2025

(51) Int. Cl.
*H01R 12/70* (2011.01)
*H01R 12/71* (2011.01)
*H01R 13/629* (2006.01)
*H05K 1/181* (2026.01)

(52) U.S. Cl.
CPC ....... *H01R 12/7023* (2013.01); *H01R 12/716* (2013.01); *H01R 13/62927* (2013.01); *H05K 1/181* (2013.01); *H05K 2201/10045* (2013.01)

(58) Field of Classification Search
CPC .............. H01R 12/7023; H01R 12/716; H01R 13/6297; H05K 1/181; H05K 2201/10045
USPC ............................................ 439/567, 607.21
See application file for complete search history.

(56) References Cited

U.S. PATENT DOCUMENTS

| | | | | |
|---|---|---|---|---|
| 6,354,849 B1 * | 3/2002 | Jones | H01R 12/585 | 439/82 |
| 7,044,807 B2 * | 5/2006 | Furuno | H01R 12/585 | 439/82 |
| 7,320,627 B2 * | 1/2008 | Skarlupka | H01R 4/10 | 439/82 |
| 7,377,823 B2 * | 5/2008 | Chen | H01R 12/585 | 439/82 |
| 7,722,413 B2 * | 5/2010 | Tonosaki | H01R 13/41 | 439/82 |
| 7,845,975 B2 * | 12/2010 | Cheng | H01R 13/658 | 439/541.5 |
| 8,771,028 B2 * | 7/2014 | Tonosaki | H01R 13/03 | 439/82 |
| 9,035,199 B2 * | 5/2015 | Janota | H05K 9/0083 | 174/385 |
| 2006/0264076 A1 * | 11/2006 | Chen | H01R 12/585 | 439/82 |
| 2010/0093197 A1 * | 4/2010 | Sander | H05K 3/308 | 439/82 |

(Continued)

OTHER PUBLICATIONS

U.S. Appl. No. 18/164,154, filed Feb. 3, 2023.

(Continued)

*Primary Examiner* — Gary F Paumen
(74) *Attorney, Agent, or Firm* — Treyz Law Group, P.C.; Tianyi He

(57) ABSTRACT

A port may include a connector and an enclosure for the connector. The enclosure may be mounted to a support substrate. The enclosure may include pins that are received within openings in the support substrate. If desired, one or more of the pins may have characteristics that improve retention of the enclosure to the support substrate. If desired, the enclosure may have indents that create a friction fit with the connector. If desired, adhesive may be used to attach the enclosure to the support substrate.

20 Claims, 8 Drawing Sheets

(56) References Cited

U.S. PATENT DOCUMENTS

2014/0099839 A1 * 4/2014 Trout .................. H01R 12/585
439/817

OTHER PUBLICATIONS

Jay Neer, SFF-8683 Specification for QSFP+ Cage, SNIA SFF TWG Technology Affiliate, Oct. 19, 2017, pp. 1-17, SNIA.
Dan Gorenc, SFF-TA-1031 Specification for SFP2 Cage, Connector, & Module Specification, SNIA SFF TWG Technology Affiliate, Jun. 11, 2023, pp. 1-27, SNIA.
Scott Sommers et al., SFF-TA-1027 Specification for QSFP2 Cage, Connector, & Module Specification, SNIA SFF TWG Technology Affiliate, May 30, 2023, pp. 1-41, SNIA.

* cited by examiner

PORT CAGE RETENTION

BACKGROUND

A mating connection between two components can be made by corresponding connectors on the two components. A cage can be provided for one of the connectors that receives the other connector. The cage can help with alignment and retention of the received connector.

DETAILED DESCRIPTION

Electrical components may be coupled to each other using corresponding connectors. As an example, a first connector may form part of a port configured to receive (mate) with a second connector. To facilitate the reception, alignment, and/or retention of the second connector, the port may include an enclosure or a cage that overlaps the first connector. The cage (and the first connector) may be mounted to an underlying support structure such as a printed circuit substrate. A retention mechanism may fix the cage position relative to the support structure. However, in some instances (e.g., when the retention mechanism omits rear pins that normally secure the rear of the cage to the support structure), the retention mechanism may fail and the cage may be undesirably detached from the underlying support structure and/or may deform.

To improve port cage retention to the support structure, the port cage may include one or more pins with one or more desired characteristics. In particular, the one or more pins may extend deeper into corresponding through-hole(s) on the support structure (e.g., extend greater than 50% across the depth of the through-hole(s) or the thickness of the support structure), may have edges with projections, and/or may include supplemental pin(s) that share through-hole(s) with pin(s) of another cage mounted to an opposite side of the support structure. If desired, to improve port cage retention to the support structure, the port cage may include indents (debossing) on sidewalls adjacent to the connector and/or may be attached, at its rear side, to the underlying support structure by using adhesive (with or without mechanical structures) instead of or in addition to having the one or more pins with the one or more desired characteristics.

Accordingly, it may be desirable to provide port cage retention mechanism(s) as described herein to improve the retention of a port cage to an underlying support structure. Configurations in which the cage is provided as part of a port within a networking system are sometimes described herein as an illustrative example. However, if desired, cages of the types described herein may be part of (e.g., may form part of connectors or ports for) other types of systems (e.g., generally computing systems, electronic systems, etc.). An illustrative system having a port with a cage mounted to an underlying support structure is shown in FIG. 1, as an example.

Figure 1:
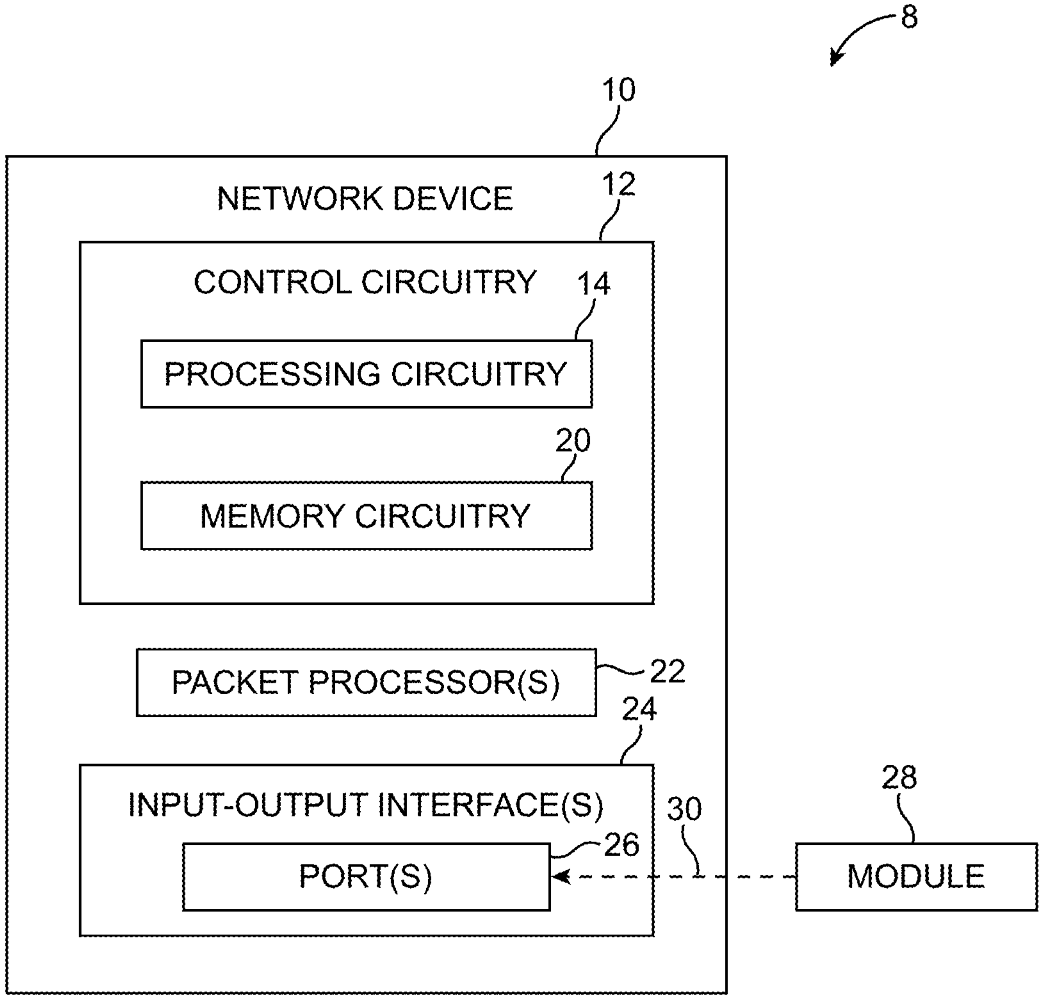
FIG. 1 is a diagram of an illustrative system having components that are coupled to each other by a mating connection in accordance with some embodiments.

In the example of FIG. 1, an illustrative system 8 may include one or more network devices 10. Each network device 10 may be a switch (e.g., a single-layer (Layer 2) switch or a multi-layer (Layer 2 and Layer 3) switch), a router or gateway, a bridge, a hub, a repeater, a firewall, a wireless access point, a network management device that manages one or more other network devices, a device serving other networking functions, a device that includes a combination of these functions, or other types of network devices. Multiple such network devices 10 (e.g., of different types and/or having different functions) in system 8 may be present and interconnected therebetween and with other network devices in other network portions to form a communications network that forwards network traffic (e.g., as frames, as packets, and/or in other forms) between end hosts.

Network device 10 may include control circuitry 12 having processing circuitry 14 and memory circuitry 20, one or more packet processors 22, and input-output interfaces 24 disposed within a housing of network device 10. The housing may include an exterior cover (e.g., a plastic exterior shell, a metal exterior shell, or an exterior shell formed from other rigid or semi-rigid materials) that provides structural support and protection for the components of network device 10 mounted within the housing. In one illustrative arrangement, network device 10 may be or form part of a modular network device system (e.g., a modular switch system having removably coupled modules usable to flexibly adjust system capabilities such as adjust the network traffic processing capabilities by changing the number of processors, memory, and/or other hardware components, adjust the number of ports, add or remove specialized functionalities, etc.). In another illustrative arrangement, network device 10 may be a fixed-configuration network device (e.g., a fixed-configuration switch having a fixed number of ports and/or a fixed hardware configuration).

Processing circuitry 14 may include one or more processors or processing units based on central processing units (CPUs), based on graphics processing units (GPUs), based on microprocessors, based on general-purpose processors, based on host processors, based on microcontrollers, based on digital signal processors, based on programmable logic devices such as a field programmable gate array device (FPGA), based on application specific system processors (ASSPs), based on application specific integrated circuit (ASIC) processors, and/or based on other processor architectures.

Processing circuitry 14 may run (e.g., execute) a network device operating system and/or other software/firmware that is stored on memory circuitry 20. Memory circuitry 20 may include one or more non-transitory (tangible) computer readable storage media that stores the operating system software and/or any other software code, sometimes referred to as program instructions, software, data, instructions, or code. As an example, network device control plane functions may be stored as (software) instructions on the one or more non-transitory computer-readable storage media (e.g., in portion(s) of memory circuitry 20 in network device 10). The corresponding processing circuitry (e.g., one or more processors of processing circuitry 14 in network device 10) may process or execute the respective instructions to perform the corresponding operations. Memory circuitry 20 may be implemented using non-volatile memory (e.g., flash memory or other electrically-programmable read-only memory configured to form a solid-state drive), volatile memory (e.g., static or dynamic random-access memory), hard disk drive storage, and/or other storage circuitry. Processing circuitry 14 and memory circuitry 20 as described above may sometimes be referred to collectively as control circuitry 12 (e.g., implementing a control plane of network device 10).

In particular, processing circuitry 14 may execute network device control plane software such as operating system software, routing policy management software, routing protocol agents or processes, routing information base agents, and other control software, may be used to support the operation of protocol clients and/or servers (e.g., to form some or all of a communications protocol stack such as the Transmission Control Protocol (TCP) and Internet Protocol (IP) stack), may be used to support the operation of packet processor(s) 22, may store packet forwarding information, may execute packet processing software, and/or may execute other software instructions that control the functions of network device 10 and the other components therein.

Packet processor(s) 22 may be used to implement a data plane or forwarding plane of network device 10. Packet processor(s) 22 may include one or more processors or processing units based on central processing units (CPUs), based on graphics processing units (GPUs), based on microprocessors, based on general-purpose processors, based on host processors, based on microcontrollers, based on digital signal processors, based on programmable logic devices such as a field programmable gate array device (FPGA), based on application specific system processors (ASSPs), based on application specific integrated circuit (ASIC) processors, and/or based on other processor architectures.

Packet processor 22 may receive incoming data packets via input-output interfaces 24, parse and analyze the received data packets, process the packets based on packet forwarding decision data (e.g., in a forwarding information base) and/or in accordance with network protocol(s) or other forwarding policy, and forward (or drop) the data packet accordingly. The packet forwarding decision data may be stored on a portion of memory circuitry 20 and/or other memory circuitry integrated as part of or separate from packet processor 22.

To interact with external devices, external systems, and/or users, network device 10 may include input-output interfaces 24 formed from corresponding input-output devices (sometimes referred to as input-output circuitry or interface circuitry). Input-output interfaces 24 may include different types of communication interfaces such as Ethernet interfaces (e.g., formed from one or more Ethernet ports), optical interfaces (e.g., formed from removable optical modules containing optical transceivers), Bluetooth interfaces, Wi-Fi interfaces, and/or other network interfaces for connecting device 10 to the Internet, a local area network, a wide area network, a mobile network, generally network device(s) in these networks, and/or other computing equipment (e.g., end hosts, server equipment, user devices, etc.). As an example, some input-output interfaces 24 (e.g., those based on wireless communication) may be implemented using wireless communication circuitry (e.g., antennas, transceivers, radios, etc.).

As another example, some input-output interfaces 24 (e.g., those based on wired communication) may be implemented on physical ports (sometimes referred to as sockets). These physical ports may be configured to physically couple to and/or electrically connect to corresponding mating connectors of external components or equipment (e.g., pluggable optical transceiver modules). Different ports may have different form-factors to accommodate different cables, different modules, different devices, or generally different external equipment.

In the example of FIG. 1, interface(s) 24 may be implemented on one or more ports 26. Port 26 may be configured to receive an extension or expansion module 28. Extension module 28 may be inserted or plugged into port 26 as indicated by arrow 30. Extension module 28 may include (electrical or optical) transceiver modules such as pluggable (e.g., removable) transceiver modules (e.g., small form-factor pluggable (SFP) modules, quad small form-factor pluggable (QSFP) modules, QSFP double density (QSFP-DD) modules, octal small form-factor pluggable (OSFP) modules, etc.) or other network interface modules, may include removable network modules that expand the functionalities of network device 10 (e.g., an asynchronous transfer mode network module, an Ethernet network module, a router or virtual private network module, a network services module, a route processor module, etc.), or may include any other suitable modules. As an example, an optical or electrical transceiver module, when plugged into or received in port 26, may enable network device 10 to be coupled to another network device 10 through a (high-speed) fiber-optic cable or a (high-speed) copper cable.

In other illustrative arrangements, one or more components such as packet processor 22 may be omitted from device 10 and device 10 may generally be a computing device with other non-networking functions. In other words, port 26 may be contained within a non-networking computing device 10 or generally a computing or electronic system that conveys electrical signals using port 26 with external equipment.

Configurations in which ports 26 include port connectors configured to receive and mate with an edge card connector of a transceiver module are sometimes described herein as an illustrative example. In other illustrative examples, ports 26 may include other types of port connectors configured to mate with edge card connectors for other components (e.g., components utilizing Peripheral Component Interconnect (PCI) connectors, Peripheral Component Interconnect Express (PCIE) connectors, accelerated graphics port (AGP) connectors, etc.) and/or other types of port connectors configured to mate with non-edge-card connectors.

Figure 2:
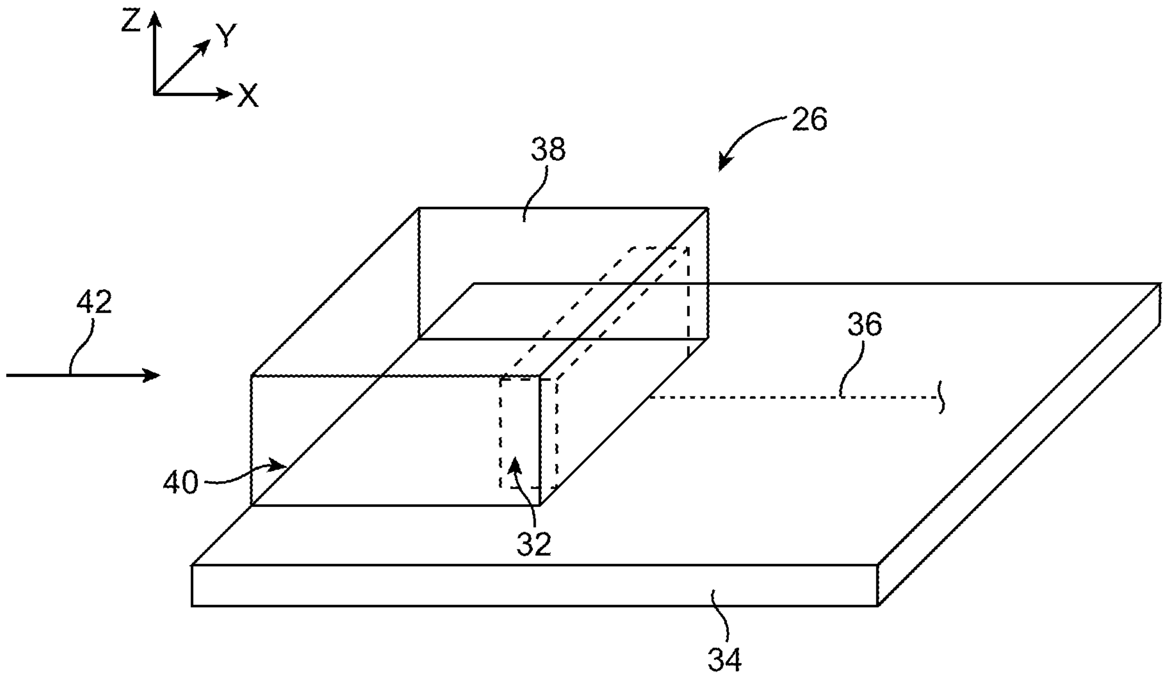
FIG. 2 is a perspective view of an illustrative port having an enclosure overlapping a connector in accordance with some embodiments.

An illustrative type of port having a connector and an accompanying enclosure or cage for the connector is shown in FIG. 2. In the example of FIG. 2, port 26 may be configured to receive module 28 (e.g., containing an edge card). Port 26 may include port connector 32 (e.g., an edge card socket) mounted to a support structure such as support substrate 34, a portion of which is shown in FIG. 2. Configurations in which substrate 34 is a printed circuit substrate (e.g., a printed circuit board) are sometimes described herein as an illustrative example. If desired, port components such as connector 32 may be mounted to other types of support structures in addition to (or instead of) a printed circuit substrate. Port 26 may be configured to receive an external component along edge 40 of substrate 34 or elsewhere on substrate 34. Substrate 34 may include signal paths 36 (e.g., conductive metal traces forming a bus or other types of signal lines) conveying signals between connector 32 (and therefore any module inserted into port 26) and the other portions of the host system (e.g., other components on network device 10 in FIG. 1 such as processing circuitry 14, memory circuitry 20, packet processor 22, other input-output devices, etc.). Connector 32 may be soldered onto printed circuit substrate 34, thereby forming electrical connections contacts on connector 32 and signal paths 38.

Connector 32 may be placed within and overlapped by an enclosure such as cage 38 (sometimes referred to as enclosure 38, port housing 38, or connector housing 38). Cage 38 may be attached to substrate 34. Cage 38 may define (surround) a cavity region having an opening along edge 40 of substrate 34. Module 28 or other external equipment containing a mating connector may be inserted (in direction 42) into the cavity region through the opening along edge 40. The side of cage 38 (adjacent to edge 40) from which the external component is received may sometimes be referred to herein as a front side of cage 38, whereas the opposite side of cage 38 at which connector 32 is disposed (away from edge 40) may sometimes be referred to as a the rear side of cage 38.

When module 28 is inserted into port 26, a mating connector on module 28 may be inserted into connector 32 of port 26. Cage 38 may serve as a guide to receive the module and facilitate the alignment and therefore the proper connection between the module connector (e.g., an edge card on module 28) and port connector 32 (e.g., a corresponding edge card socket). If desired, other guide and/or alignments structures may be included in addition to cage 38 or as part of cage 38 (e.g., surface features on cage 38).

To serve as a reliable guide, cage 38 may be fixed in position relative to substrate 34 (and therefore fixed in position relative to connector 32, which is also fixed in position relative to substrate 34). In some configurations described herein as an illustrative example, substrate 34 may include openings or holes. Cage 38 may include extensions (e.g., retention pins) that extend into the openings to secure cage 38 to substrate 34.

In particular, cage 38 may have a bottom surface (e.g., on a planar bottom wall parallel to the x-y plane) that rests on substrate 34. The bottom surface may include an opening at the rear side of cage 38 to accommodate the solder connection between connector 32 and substrate 34. Cage 38 may have a top surface (e.g., on a planar top wall parallel to the x-y plane) opposite the bottom surface. Cage 38 may include sidewalls (e.g., left and right sidewalls when viewed in direction 42) each parallel to the x-y plane and each connecting the top surface to the bottom surface. Cage 38 may include a sidewall parallel to the y-z plane that backs connector 32 and defines the rear of cage 38. Cage 38 may lack a sidewall parallel to the y-z plane at the front of cage 38 to create the opening through which the internal cavity containing connector 32 is accessible by an external component. Cage 38 (e.g., its walls) may be formed from one or more rigid or stiff materials such as metal, hard polymer, etc., which helps cage 38 maintain its shape during installation and repeated use.

The retention pins of cage 38 may be provided at the bottom surface of cage 38 along opposite edges of the bottom surface (along bottom left and bottom right edges parallel to the x-axis when viewed in direction 42). These retention pins may extend away from the bottom surface in the −z direction and may be inserted into corresponding openings in substrate 34 as (the bottom surface of) cage 38 rests on the top surface of substrate 34.

Figure 3:
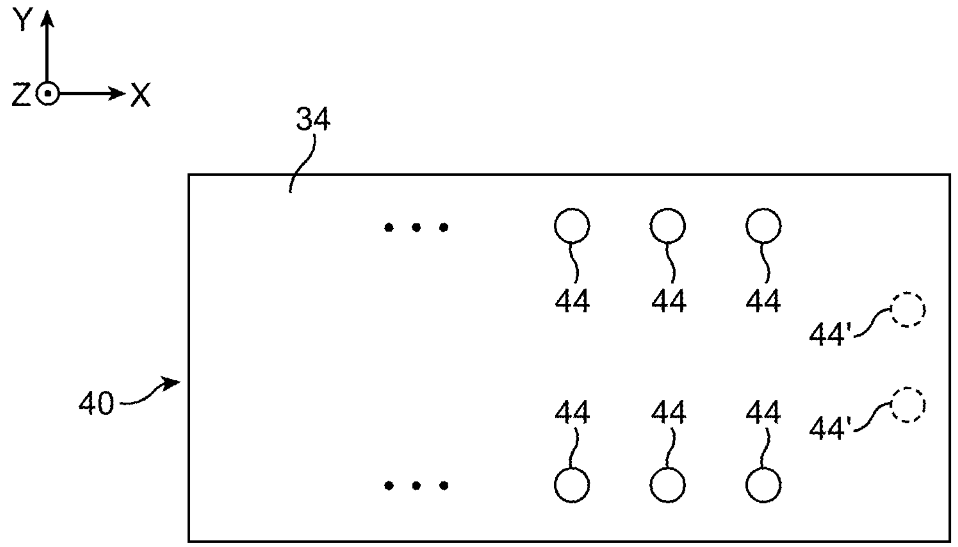
FIG. 3 is a plan view of an illustrative portion of a support substrate to which a port cage is mounted in accordance with some embodiments.

FIG. 3 is a plan view of an illustrative portion (e.g., area) of a support substrate such as substrate 34 to which a port cage such as cage 38 is mounted. In the example of FIG. 3, substrate 34 includes two rows of openings 44 along the opposite sides of the substrate area (e.g., top and bottom sides in the perspective of FIG. 3). These two rows of openings 44 may be configured to receive two corresponding rows of retention pins along opposite edges of the bottom surface of cage 38. In some arrangements, substrate 34 may include additional openings 44' at a rear side of the substrate area away from edge 40. These openings may be configured to receive rear pins on cage 38 (e.g., pins on cage 38 that are disposed along the rear edge of the bottom surface of cage 38 opposite the front side of cage 38). In other words, the portion of substrate 34 in FIG. 3 that is overlapped by cage 38 may have openings along three of its sides.

Substrate 34 may include numerous openings 44 and/or 44', some of which are occupied by retention pins of cage 38, some of which are occupied by retention pins of one or more other cages (e.g., a cage mounted to a surface of substrate 34 opposite the surface to which cage 38 is mounted), some of which are occupied by other components, and/or some of which are unoccupied. In general, to reliably secure cages to substrate 34, openings 44 may be provided from the front side of the substrate portion in FIG. 3 (at edge 40) to the rear side of the substrate portion in FIG. 3 (at openings 44'). While pairs of openings 44 are shown to be aligned in the y-dimension, this arrangement is merely illustrative. If desired, pairs of openings 44 may be offset in the y-dimension and/or openings 44 may be arranged in more than two rows (along the x-dimension).

Configurations in which openings 44 and 44' are through-holes that extend through substrate 34 (e.g., across the entire thickness, in the z-dimension, of substrate 34) are sometimes described herein as an illustrative example. If desired, some or all of openings 44 and 44' may be holes that extend only partially through substrate 34.

Only the portion of substrate 34 overlapped by cage 38 is depicted in FIG. 3. The entirety of substrate 34 may extend well beyond the boundaries shown in FIG. 3. Multiple cages 38 for multiple connectors and/or other components (e.g., processing circuitry 14, memory circuitry 20, packet processors 22, other input-output interface components, etc., in FIG. 1) may be mounted to portions of substrate 34 not shown in FIG. 3.

Figure 4:
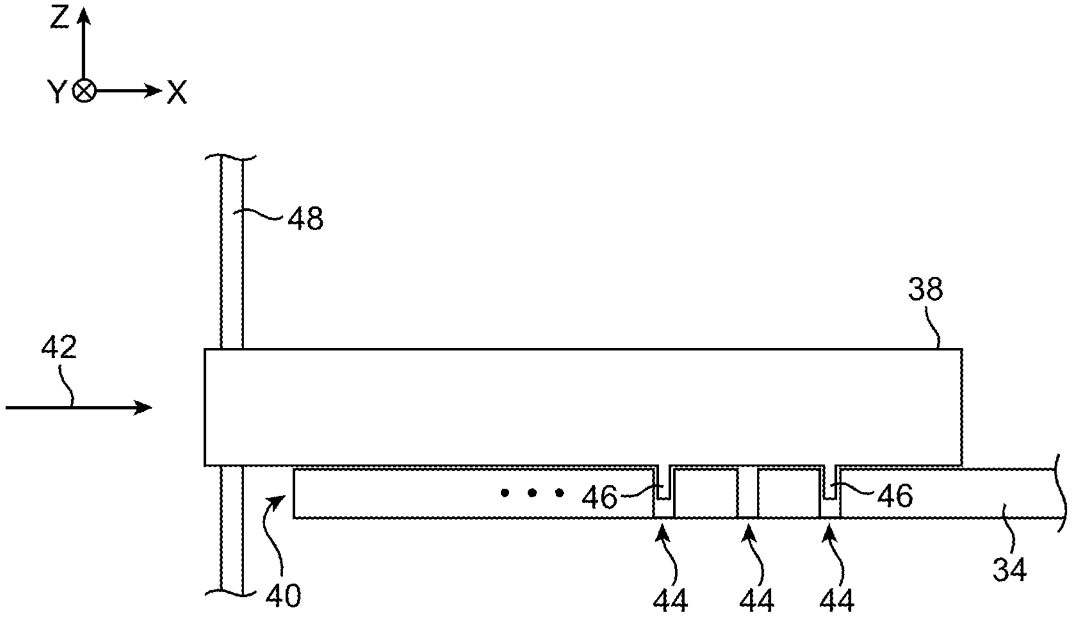
FIG. 4 is a side view of an illustrative port having a cage with retention pins in accordance with some embodiments.

FIG. 4 is a side view of a port within a device (e.g., port 26 in network device 10). As shown in FIG. 4, the device (e.g., device 10) may have a housing that includes housing wall 48 (e.g., a front or back cover, a front or back panel, etc.). Port cage 38 may provide the opening for port 26 at wall 48 such that external components (e.g., modules, cables, etc.) are inserted in direction 42 into the port opening at wall 48. In example of FIG. 4, cage 38 includes retention pins 46 that are inserted into openings 44 on substrate 34. Pins 46 and the sidewalls of openings 44 in which the corresponding pins 46 are inserted apply retention forces (e.g., frictional forces), which retains cage 38 to substrate 34.

As shown in FIG. 4, pins 46 may be configured (e.g., formed or placed on cage 38) to align with corresponding openings 44 in substrate 34. As described in connection with FIGS. 2 and 3, cage 38 may include two sets of retention pins each arranged in a linear manner along opposite edges of the bottom surface of cage 38. One set of pins 46 is shown in and described in connection with FIG. 4 (and generally FIGS. 5-8). The other set of pins 46 may have the same configuration (e.g., be directly behind, in the +y direction, the set of pins 46 depicted in FIG. 4 and in FIGS. 5-8) or may have a different configuration. If desired, the other set of pins 46 may be offset from the set of pins 46 depicted in FIG. 4 when viewed in the +y direction.

Each pin in the set of pins along an edge of the bottom surface of cage 38 may be separated from an adjacent pin by the same distance. In other words, pins 46 may be regularly spaced along the edge of the bottom surface of cage 38. In example of FIG. 3, there may be fewer pins 46 than there are openings 44 in substrate 34. In such a manner, some of openings 44 may lack corresponding inserted pin(s) when cage 38 is mounted to substrate 34. As such, pins 46 may occupy every other opening 44. This configuration is merely illustrative.

Cage 38 and its pins 46 may be formed from metal or other rigid materials. Pins 46 may be formed as an integral part of cage 38 (e.g., pins 46 may extend continuously from the sidewalls of cage 38). If desired, pins 46 may be separately attached (e.g., welded, adhered, etc.) to the cage 38.

In some instances (e.g., when rear pins that are typically inserted into openings 44' in FIG. 3 are omitted from cage 38), cage 38 may more easily exhibit retention failure modes such as being undesirably detached from underlying substrate 34 and/or being deformed, thereby adversely affecting its ability to properly guide any inserted component to connector 32. To enhance the retention of port cage 38 to underlying substrate 34, thereby reducing the likelihood of retention failure modes, various mechanisms as described herein may be used. These mechanisms and/or port features may be used separately or in combination with one another.

Figure 5:
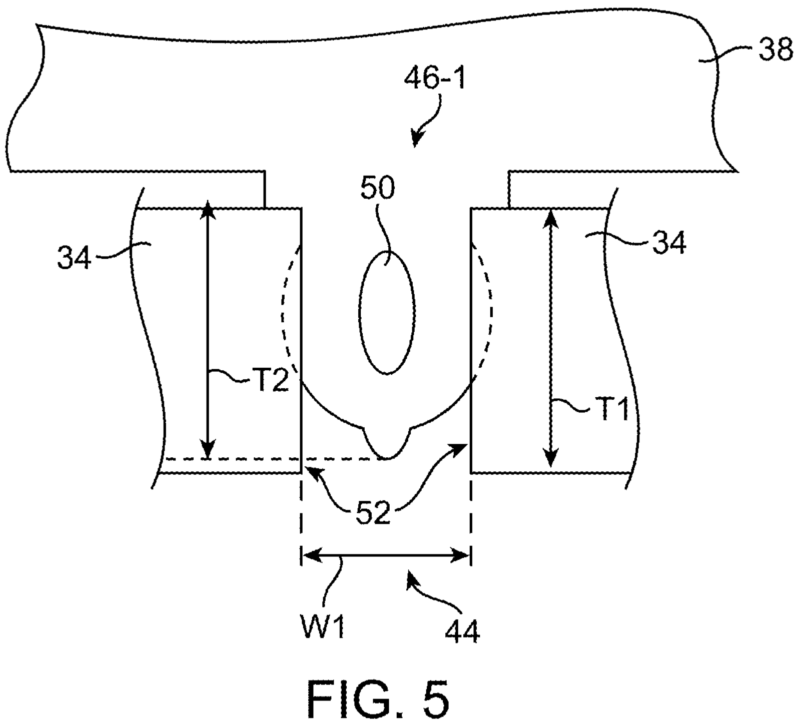
FIG. 5 is a diagram of an illustrative cage pin having an extended length in a hole in a substrate in accordance with some embodiments.

In one illustrative arrangement, cage 38 may include one or more retention pins 46 each having an extended length (e.g., compared to at least some of the other retention pins 46 of cage 38). FIG. 5 is a diagram of an illustrative cage having a retention pin that extends deeply into a corresponding opening in the supporting substrate. In the example of FIG. 5, an illustrative opening 44 (e.g., through-hole) of substrate 34 is shown. Cage 38 includes an extended portion forming an illustrative pin 46-1 that extends from the base (bottom surface) of cage 38 into opening 44. Pin 46-1 extends into opening 44 when cage 38 is mounted to substrate 34.

Opening 44 may have a width W1 (distance W1) separating opposing sides (edges) 52 of opening 44 (e.g., a cylindrical opening having a circular outline as shown in FIG. 3). Pin 46-1 may have a corresponding width (at its widest section) that is greater than width W1 such that when pin 46-1 is inserted, edges 52 of opening 44 are in contact with the edges of pin 46-1, thereby providing frictional forces or generally retention forces that help retain pin 46-1 within opening 44.

Opening 44 may be a through-hole that extends across a thickness T1 (distance T1) of substrate 34. In order to increase the retention force, pin 46-1 may have an extended length compared to at least some of the other pins 46 of cage 38. Accordingly pin 46-1 may extend deeply into opening 44, thereby increasing the contact area between the edges of pin 46-1 and edges 52 of opening 44.

In the example of FIG. 5, pin 46-1 may have a linear main body that extends from a proximal end attached to a base (bottom surface) of cage 38 to a distal end that extends into opening 44. The main body of pin 46-1 may have a length T2 (distance T2) in opening 44. Distance T2 may be at least 50%, more than 60%, more than 70%, more than 75%, more than 80%, more than 90%, less than 95%, less than 90%, and/or less than 85% of thickness T1.

Additionally, the main body of pin 46-1 may include an opening 50 and/or any other suitable features that facilitate the retention of pin 46-1 within opening 44. Opening 50 may split the main body of pin 46-1 into two segments each providing a spring force that presses against the adjacent edge 52 of opening 44. Because of the increased length of the main body of pin 46-1, opening 50 may also be further elongated, thereby configuring the divided segments of the main body to maintain more spring force in the divided segments. Configured in this manner, the retention force between pin 46-1 and edges 52 may be increased (relative to other pins 46 of cage 38 that have a shorter main body length and therefore shorter elongated opening 50), thereby improving retention of pin 46-1. If desired, pin 46-1 may include a pointed (sharp) distal end to facilitate the formation of opening 50 and corresponding divided spring segments.

Figure 6:
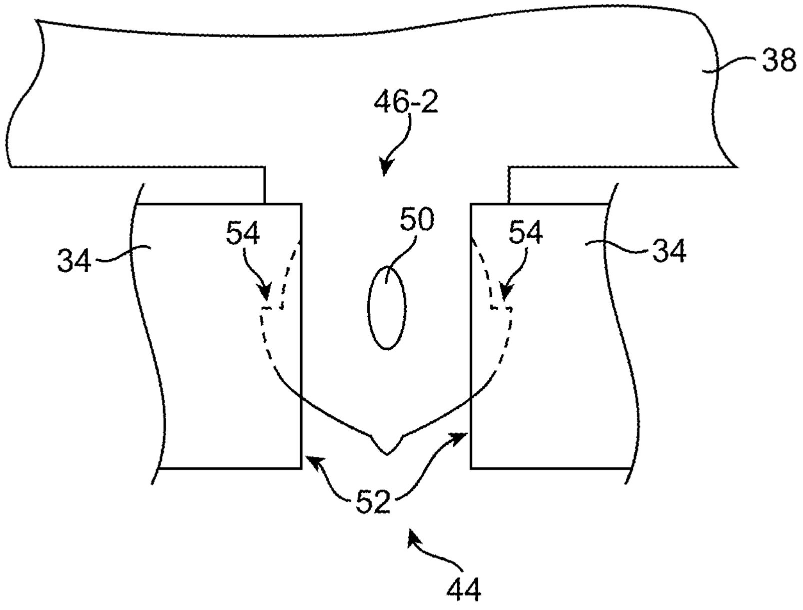
FIG. 6 is a diagram of an illustrative cage pin that has serrated edges in accordance with some embodiments.

In some instances, one or more pins 46 of cage 38 may include edge features that help retain pins 46 within corresponding openings 44 in substrate 34. As shown in FIG. 6, an illustrative pin 46-2 may have edge features such as serrations 54 on opposite edges of the pin 46-2. Serrations 54 may include barbs, hooks, spikes, (sharp or pointed) projections, and/or other edge irregularities (e.g., a saw-like or tooth-like structure, jagged structures, etc.).

In particular, pin 46-2 may include a linear main body (e.g., that extends along a longitudinal dimension or in a first direction). These irregular edge features (e.g., serrations 54) may extend laterally or angled away from the main body (e.g., in different directions that are non-parallel to the first direction aligned with the longitudinal dimension of the main body). In the example of FIG. 6, a first edge may include a single serration 54 (e.g., a projection pointed in direction different from and non-parallel to the first direction) and an opposite edge may include a single serration 54 (e.g., a projection pointed in another direction different from and non-parallel to the first direction). If desired, multiple serrations may be provided on each edge of pin 46-2.

Pin 46-2 (similar to pin 46-1 and/or other pins 46 of cage 38) may include a central opening 50 that splits the main body into two segments on opposite sides of opening 50. The serration(s) 54 on a first edge may extend from one of the two segments and the serration(s) 54 on a second edge may extend from the other one of the two segments.

Pin edge features (e.g., serrations 54) may provide one or two serrated edges for pin 46-2 that increase the frictional coefficient pin 46-2 and edges 42 and thereby the amount of force needed to remove pin 46-2 once inserted into opening 44. Accordingly, providing one or more serrated edges to a pin may configure the pin to latch onto sidewalls 52 of opening 44, thereby facilitating enhanced retainment of the pin within opening 44.

Figure 7:
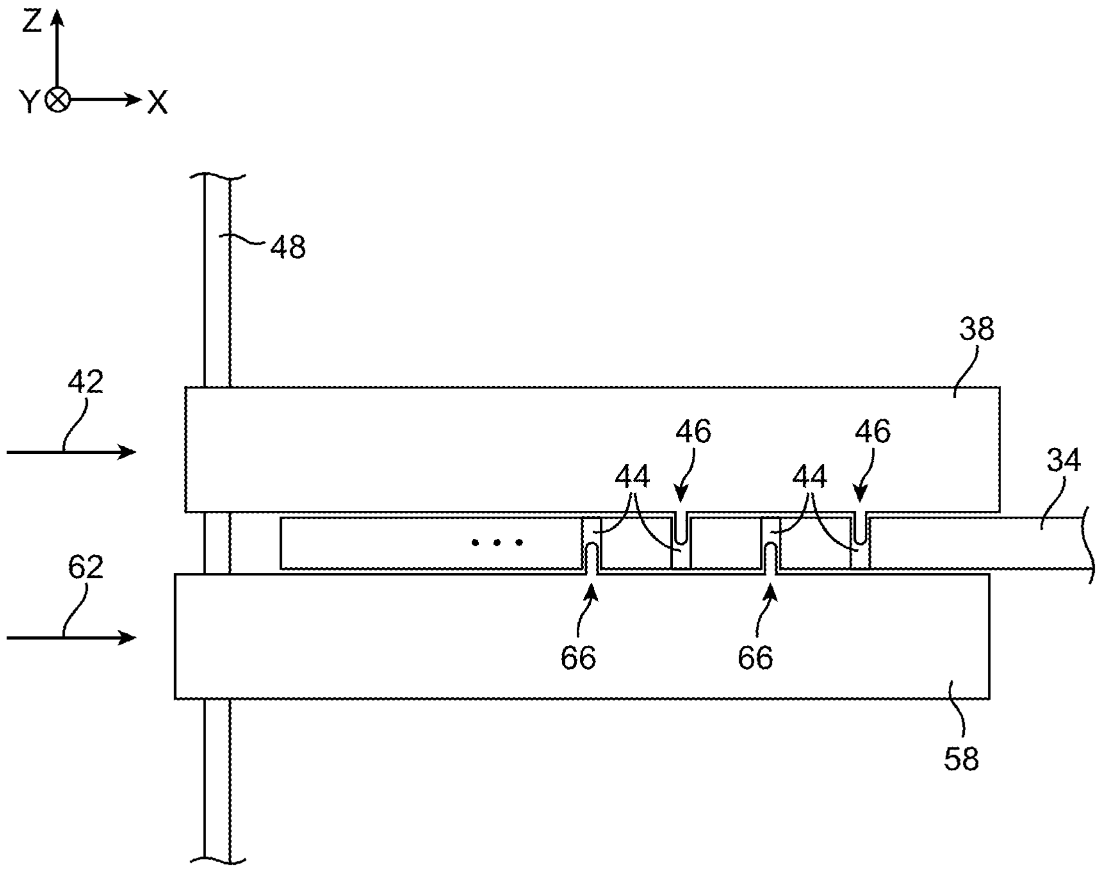
FIG. 7 is a side view of a pair of ports having respective overlapping cages mounted to a shared substrate in accordance with some embodiments.

A device such as network device 10 (FIG. 1) may have numerous ports 26 (e.g., of the types shown in FIGS. 2 and 4). In order to provide ports 26 in a compact manner within the device, multiple ports 26 may be provided in close proximity with each other at the front or back of the device. Components of these ports 26 (e.g., corresponding connectors, cages, and/or other port components) may be mounted to a shared support structure (e.g., a supporting substrate such as substrate 34). FIG. 7 is a diagram of an illustrative device that includes multiple ports with corresponding port enclosures mounted to a common substrate. In the example of FIG. 7, ports 26 may be provided at housing wall 48 (e.g., at a front or back cover of a device housing). Corresponding external component(s) (e.g., modules, cables, etc.) may be inserted into corresponding cages 38 and 58 for these ports 26 in directions 42 and 62, respectively.

Substrate 34 may be provided between cage 38 and cage 58. In a similar configuration as described in connection with FIG. 4, cage 38 in FIG. 7 may include pins 46 that extend into some openings 44 of substrate 34 to retain cage 38 to substrate 34. Cage 58 may include pins 66 that extend into other openings 44 of substrate 34 to retain cage 58 to substrate 34. Similar to openings 5 in pins 46, pins 66 may also include openings 70. In other words, substrate 34 may include a plurality of openings 44 (e.g., as shown in FIG. 3) some of which are used by a top-mounted cage 38 and corresponding port and some of which are used by a bottom-mounted cage 38 and corresponding port.

Figure 8:
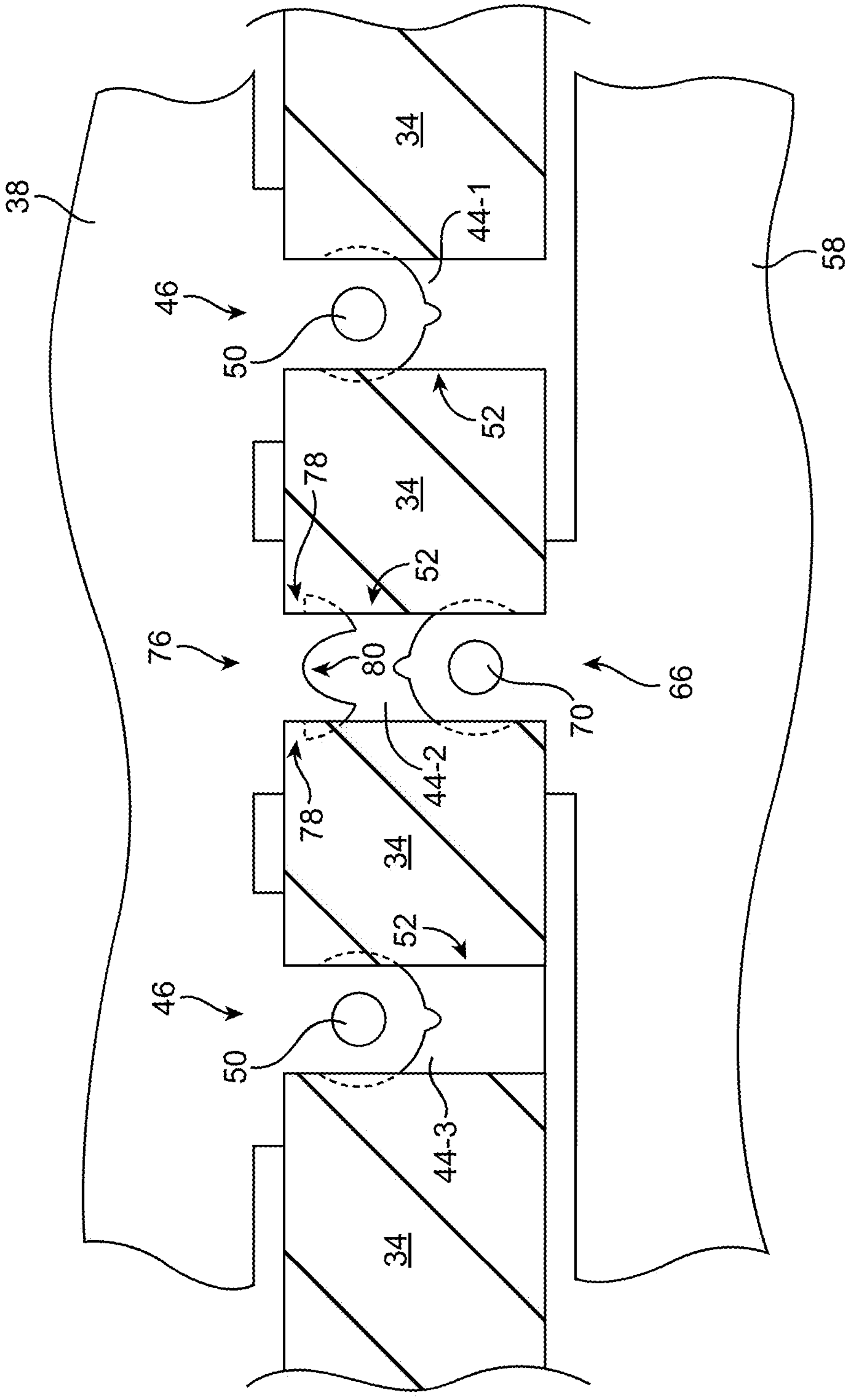
FIG. 8 is a side view of an illustrative portion of a substrate that receives a supplemental pin of a port cage in accordance with some embodiments.

In arrangements where pins 46 and/or 66 only extend partially through openings 44 (e.g., partially through the thickness of substrate 34), one or more supplemental pins may be provided on one or both of cages 38 and 58 that share an opening 44 with a regular pin of the opposite cage. FIG. 8 is a side view of an illustrative portion of substrate 34 that receives a cage having a shorter supplemental pin in addition to longer (regular) pins. In the example of FIG. 8, three illustrative openings 44-1, 44-2, and 44-3 in substrate 34 are shown. Cage 38 may include illustrative pins 46 (e.g., pins of the type described in connection with FIGS. 5 and 6, or other types of pins) in openings 44-1 and 44-3. If desired, additional pins 46 of cage 38 may also be inserted in additional openings 44 of substrate 34. Cage 58 mounted to the opposite side of substrate 34 may include a pin 66 in opening 44-2 (and additional pins 66 in additional openings 44 of substrate 34). Because pin 66 does not extend across the entire thickness of substrate 34, there may be sufficient space in opening 44-2 such that cage 38 can be provided with an additional (supplemental) pin 76 that is inserted into opening 44-2 and that shares opening 44-2 with pin 66 of opposite cage 58.

Because pin 66 is inserted to take up a substantial part of opening 44-2 (e.g., the distal end of pin 66 extends more than 50%, more than 60%, more than 70%, etc., across the thickness of substrate 34), supplemental pin 76 may be shorter compared to some of the other (regular) pins 46 of cage 38 and compared to some of the other (regular) pins 66 of cage 58 (e.g., the pin 66 in opening 44-2). As examples, the distal end(s) of pin 76 may extend less than 508, less than 40%, less than 30%, etc. across the thickness of substrate 34 (e.g., the length of pin 76 is less than 50%, less than 40%, less than 30%, etc., of the thickness of substrate 34). In some arrangements pins 46 of cage 38 may have the same first length as pins 66 of cage 58 and/or supplemental pins 76 of cage 38 may have the same second length as supplemental pins of cage 58 (when present), where the second length is shorter than the first length.

If desired, supplemental pin 76 may include a notch such as notch 80 at its distal end. Notch 80 may provide additional clearance for pin 66 of cage 58 and/or accommodate a tolerance in the length of inserted pin 66. If desired, supplemental pin 76 may include edge features such as serrations 78 (e.g., of the types described in connection with serrations 54 in FIG. 6). In particular, notch 80 may split the main body of pin 76 into two segments, a first of which has the first serrated edge and a second of which has the second serrated edge.

While a single supplemental pin 76 for cage 38 is shown in FIG. 8, this is merely illustrative. If desired, multiple supplemental pins 76 may be provided for cage 38. If desired, supplemental pins may be provided even if no opposite cage is attached and/or an attached opposite cage lacks a pin in the same opening. If desired, cage 58 may include one or more supplemental pins of the type described in connection with cage 38. As an example, cage 58 may include one or two supplemental pins in one or both of openings 44-1 and 44-3 that share that opening with inserted pins 46 of cage 38.

As described in connection with FIGS. 4-8, one or two cages mounted to the same overlapping area of a substrate may each include various types of specialized cage pins for improving cage retention to the underlying substrate. These specialized cage pins may include elongated extended pins in the example of FIG. 5, pins with serrated edges in the example of FIG. 6, supplemental pins in the example of FIG. 8, or a combination of these types of pins. These specialized cage pins may be selectively provided on cage 38 (e.g., preferentially provided at the rear side of cage 38).

As an example, cage retention issues may arise more frequently in certain types of cages that lack rear retention pins (e.g., cages that lack pins that are inserted into rear openings 44' in FIG. 3). Accordingly, it may be desirable to further bolster retention forces at the rear side of the cage. As such, specialized pins for increasing retention (e.g., elongated extended pins, pins with serrated edges, supplemental pins, or a combination of these types of pins) may be provided toward the rear of the cage. In arrangements where a cage includes five pins along a first bottom edge of the cage (inserted into the top row of openings 44 in FIG. 3), includes five pins along a second bottom edge of the cage (inserted into the bottom row of openings 44 in FIG. 3), and omits pins at the rear of the cage (if present, would be inserted into rear openings 44' in FIG. 3), the cage may include the specialized pins as the last pin (closest to the rear of the cage) along both the first and second bottom edges, as the last two pins (closest to the rear of the cage) along both the first and second bottom edges, or as the last three pins (closest to the rear of the cage) along both the first and second bottom edges. The front two pins (farthest from the rear of the cage) along both the first and second bottom edges may lack these types of specialized pins. This example is merely illustrative. If desired, a cage may include any suitable number of specialized pins at any suitable location (e.g., all of the pins, the pins along the first and second bottom edges toward the front side of the cage, in the middle of the cage, and/or toward the rear side of the cage, etc.) that improve cage retention.

As described in connection with FIGS. 2-4, linear sets of pins 46 along first and second edges of the bottom surface of cage 38 may each have a regular spacing between pairs of adjacent pins 46. In some illustrative arrangements described herein as examples, the selective inclusion of supplemental pin(s) 76 between only some of the pairs of adjacent pins 46 (e.g., near the rear of the cage) may disrupt this regular spacing of pins on cage 38 (e.g., cage 38 may have smaller regular spacing between adjacent pins where pin(s) 76 are provided and a larger (regular) spacing between adjacent pins 46 where pin(s) 76 are omitted).

In addition to or instead of specialized pins, a port cage may include other features for improving retention to the underlying substrate or otherwise for fixing or securing its location. In particular, a port cage may include features that increase its retention to the port connector and/or other port elements that are attached to the underlying substrate. Through the use of these other feature(s), the port cage may further secure its position.

Figure 9:
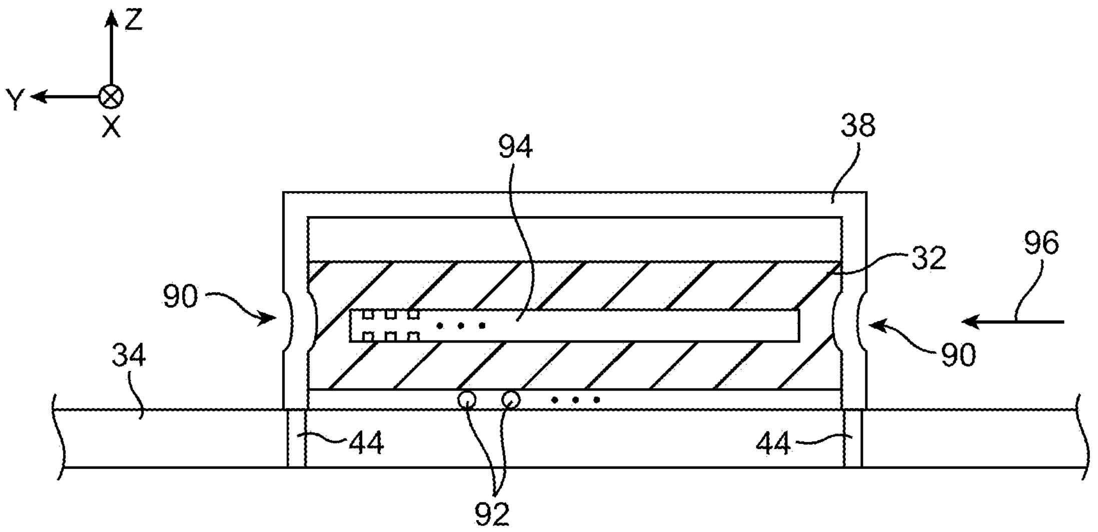
FIG. 9 is a side view of an illustrative port having a cage with indents on sidewalls adjacent to a port connector in accordance with some embodiments.

FIG. 9 is a side view of an illustrative port cage having surface features on its sidewalls that press against the adjacent port connector. In particular, the view of FIG. 9 may be taken when viewing port 26 in direction 42 (FIG. 2).

As shown in FIG. 9, port connector 32 may be mounted to substrate 34 via (mechanical and/or electrical) connection mechanisms such as solder 92 connecting electrical contacts of connector 32 to corresponding signal paths 36. Connector 32 may include an opening 94 configured to receive a mating connector (e.g., a mating edge card connector). Opening 94 may expose electrical contacts for connector 32 that connect to corresponding contacts of the mating connector when the mating connector is inserted into opening 94.

Cage 38 may include left and right sidewalls having surface indents 90 (sometimes referred to depressions, or debossing or embossing). Indents 90 may press against the corresponding left and right sides of connector 32 to secure the cage position relative to connector 32. In other words, the debossing (or embossing from the interior-to-exterior perspective) on left and right sidewalls of cage 38 may serve to provide (e.g., create) a friction fit (sometimes referred to as a pressed fit or an interference fit) with connector 32 (when cage 38 is pressed over connector 32). This increases the frictional forces between cage 38 (at its indented portions of the left and right sidewalls) and connector 32.

Figure 10A:
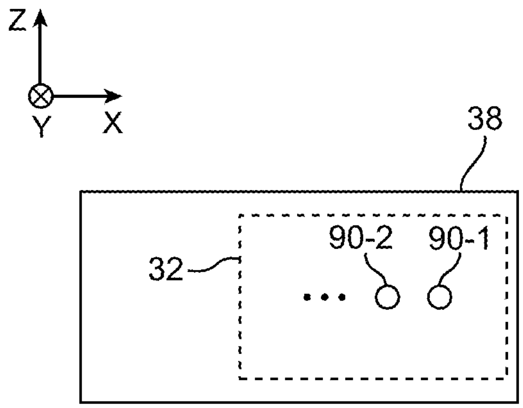
FIGS. 10A and 10B are side views of illustrative types of indents on a port cage in accordance with some embodiments.
Figure 10B:
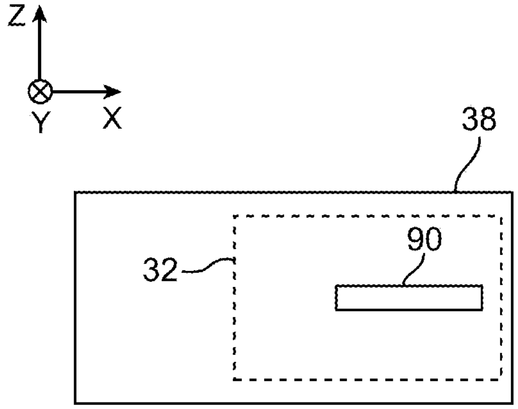

Illustrative patterns of debossing 90 when viewed in direction 96 (FIG. 9) are shown in FIGS. 10A and 10B. In the example of FIG. 10A, debossing 90 may include a series of smaller circular indents 90-1, 90-2, etc., spread out in an area of the cage sidewall that overlaps connector 32. In the example of FIG. 10B, debossing 90 may include a single continuous rectangular indent 90 in an area of the cage sidewall that overlaps connector 32. These examples are merely illustrative. If desired, any suitable number of separate indents 90 of any suitable shapes and/or dimensions may be on the sidewall of cage 38 to provide the friction fit of cage 38 over connector 32. While one side of cage 38 (e.g., the right side in the perspective of FIG. 9) is illustrated in FIG. 10A or FIG. 10B, the other side of cage 38 (e.g., the left side in the perspective of FIG. 9) may have the same pattern (e.g., a mirrored version of the same pattern) or a different pattern than those on the side of cage 38 depicted in FIG. 10A or FIG. 10B.

In addition to or instead of specialized pins and/or indented cage sidewall portions, a port cage may be provided with other features for improving retention to the underlying substrate and/or otherwise for fixing or securing its location. In particular, a port cage may be attached to other port components and/or the underlying substrate using adhesive with or without intervening mechanical parts. Through the use of these other feature(s), the port cage may further secure its position.

Figure 11:
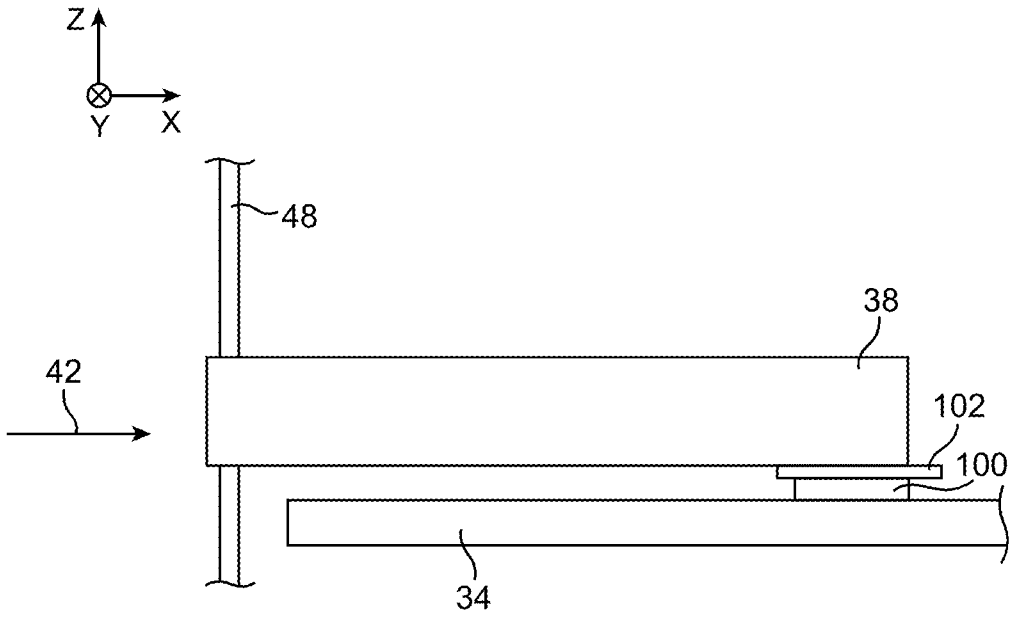
FIG. 11 is a side view of an illustrative port having a cage attached to a substrate at the rear of the cage using adhesive in accordance with some embodiments.

FIG. 11 is a side view of an illustrative cage that is attached to an underlying substrate using adhesive (e.g., an adhesive layer). In the example of FIG. 11, cage 38 may be attached to underlying substrate 34 via adhesive 100 (e.g., a layer of adhesive). In some arrangements (e.g., where the bottom surface of cage 38 is not conducive to adhesion by adhesive 100, the bottom surface has one or more openings at the rear side of cage 38, the bottom surface is uneven at the rear side of cage 38, etc.), a structures such as a planar tab 102 may be provided at the bottom surface of cage 38 and at the rear of cage 38. In one illustrative configuration, tab 102 may be formed as an integral part of cage 38 (e.g., cage 38 may be constructed with a planar tab structure at its bottom surface). In another illustrative configuration, tab 102 may be attached to the bottom surface of cage 38 via a suitable attachment mechanism (e.g., adhesive, welds, screws, etc.).

In other words, tab 102 may be provided as an intervening structure at the rear side of the bottom surface of cage 38 to provide an adhesion surface that facilitates improved contact to adhesive 100 and therefore enhanced adhesion via adhesive 100 to underlying substrate 34.

Figure 12:
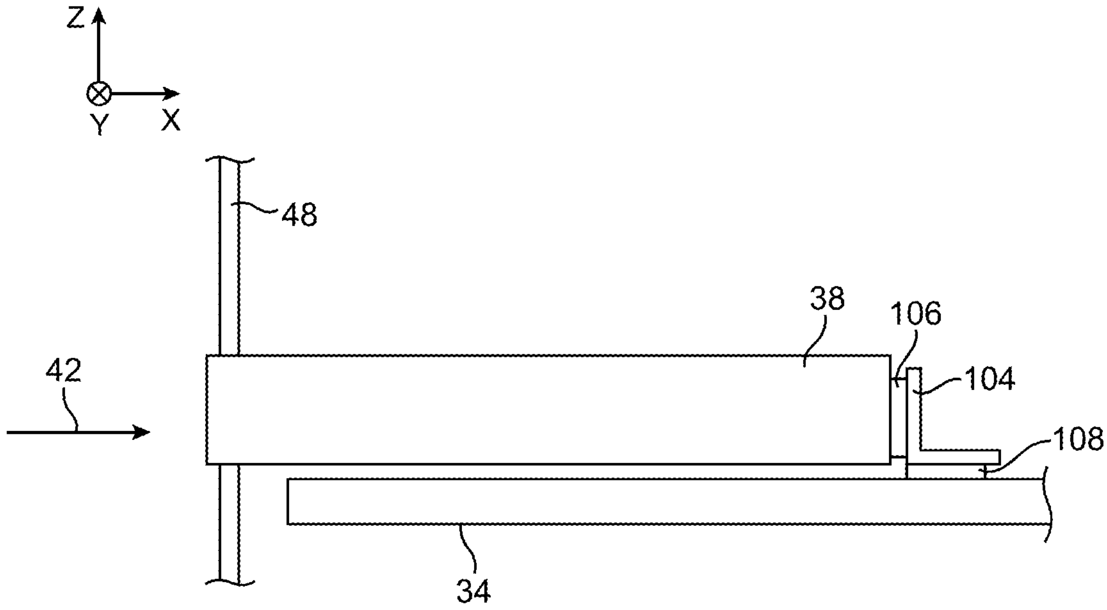
FIG. 12 is a side view of an illustrative port having a cage attached to a substrate at the rear of the cage using a bracket in accordance with some embodiments.

If desired, other mechanical structures may be provided to join, connector, and/or otherwise secure the rear side of cage 38 to substrate 34. FIG. 12 is a side view of an illustrative cage that is attached to an underlying substrate using a bracket. In the example of FIG. 12, bracket 104 may have adjacent adhesion surfaces that connect the rear sidewall of cage 38 to underlying substrate 34. In particular, a first layer of adhesive 106 may attach the rear sidewall of cage 38 to a first surface of bracket 104. A second layer of adhesive 108 may attach substrate 34 to a second surface of bracket 104. In such a manner, bracket 104 may secure the rear of cage 38 to substrate 34.

The types of adhesive that may be used for adhesive layer 100 in FIG. 11 and/or adhesive layers 106 and/or 108 in FIG. 12 may include a pressure-sensitive adhesive, an adhesive tape, a liquid adhesive, and/or any other suitable types of adhesive. If desired, fasteners or other types of attachment structures may be used instead of or in addition to adhesive to facilitate attachment of the rear side of cage 38 to substrate 34.

The foregoing is merely illustrative and various modifications can be made to the described embodiments. The foregoing embodiments may be implemented individually or in any combination.

What is claimed is:

1. A network device comprising:

a printed circuit substrate having a plurality of openings; and a port configured to receive an external component, wherein the port includes:

a connector mounted to the printed circuit substrate; and an enclosure for the connector that is mounted to the printed circuit structure and configured to guide the external component to the connector, wherein the enclosure includes, at a bottom surface of the enclosure, a plurality of pins that extend into corresponding openings in the plurality of openings, wherein the plurality of pins include a first set of pins along a first edge of the bottom surface and include a second set of pins along a second edge of the bottom surface that is opposite the first edge, wherein the enclosure lacks any pins along a rear edge of the bottom surface that connects the first and second edges, and wherein a given pin, in the first set of pins, closest to the rear edge along the first edge has an edge that is serrated.

2. The network device defined in claim 1, wherein the bottom surface rests on the printed circuit substrate, wherein each pin of the plurality of pins protrudes away from the bottom surface and into the corresponding opening in the printed circuit substrate, wherein the given pin has a main body that extends in a first direction, and wherein the edge of the given pin includes a projection that extends away from the main body in a second direction that is non-parallel to the first direction.

3. The network device defined in claim 2, wherein the given pin includes an additional serrated edge opposite the edge of the given pin and wherein the additional serrated edge includes an additional projection that extends away from the main body in a third direction that is non-parallel to the first direction.

4. The network device defined in claim 3, wherein the main body has an opening that is elongated along the first direction and has first and second segments on opposite sides of the opening, wherein the projection extends away from the first segment, and wherein the additional projection extends away from the second segment.

5. The network device defined in claim 1, wherein the enclosure has an opening at a front side configured to receive the external component, wherein the enclosure has a rear side that overlaps the connector, and wherein the first set of pins extends from the front side to the rear side.

6. The network device defined in claim 1, wherein the plurality of pins comprise at least two pins of different lengths.

7. The network device defined in claim 1, wherein the external component comprises a pluggable transceiver module.

8. The network device defined in claim 1, wherein at least one pin in the plurality of pins has a portion within the corresponding opening in the plurality of openings and wherein the portion has a length that is greater than 50% and less than 95% of a thickness of the printed circuit substrate.

9. The network device defined in claim 1 further comprising:

an additional port configured to receive an additional external component, wherein the additional port includes:
 an additional connector mounted to the printed circuit substrate; and
 an additional enclosure for the additional connector that is mounted to the printed circuit substrate and configured to guide the additional external component to the additional connector, wherein the additional enclosure includes an additional plurality of pins that extend into corresponding openings in the plurality of openings, wherein the port is disposed on a first side of the printed circuit substrate, and wherein the additional port is disposed on a second side of the printed circuit substrate opposite the first side.

10. The network device defined in claim 9, wherein the given pin extends into a given opening in the plurality of openings and wherein an additional given pin in the additional plurality of pins extends into the given opening.

11. The network device defined in claim 10, wherein the given pin is shorter than the additional given pin.

12. The network device defined in claim 1, wherein the enclosure has an opening at a front side configured to receive the external component, wherein the enclosure has a rear side that overlaps the connector, and wherein the enclosure has a sidewall extending from the front side to the rear side and having an indented portion configured to provide a friction fit with the connector.

13. The network device defined in claim 1, wherein the enclosure has an opening at a front side configured to receive the external component, wherein the enclosure has a rear side that overlaps the connector, and wherein the rear side of the enclosure is attached to the printed circuit substrate using adhesive.

14. The network device defined in claim 13 further comprising:

a structure that is a tab or a bracket, wherein the enclosure is joined with the printed circuit substrate with the structure and the adhesive.

15. A computing system comprising:

a printed circuit substrate having a plurality of openings;

a first cage for a first port mounted to the printed circuit substrate, wherein the first cage has a first pin in a first opening in the plurality of openings and has a second pin in a second opening in the plurality of openings, wherein the first pin has a first length, and wherein the second pin has a second length that is less than the first length; and a second cage for a second port mounted to the printed circuit substrate, wherein the second cage has a first pin in the second opening.

16. The computing system defined in claim 15, wherein the second pin has a serrated edge.

17. The computing system defined in claim 15, wherein the first pin of the second cage has the first length.

18. The computing system defined in claim 15 further comprising:

a connector for the first port, wherein the first cage has an opening at a front side configured to receive an external component, wherein the first cage has a rear side that overlaps the connector, and wherein the rear side of the first cage is attached to the printed circuit substrate using adhesive.

19. A port cage configured to receive an external component and guide the external component to a port connector, the port cage including a front side through which the external component is received and a rear side opposite the front side and the port cage comprising:

top and bottom surfaces;

a first plurality of pins along a first edge on the bottom surface that protrude away from the bottom surface;

a second plurality of pins along a second edge on the bottom surface that protrude away from the bottom surface; and first and second sidewalls that each extend from the front side to the rear side, each connect the top surface to the bottom surface, and each include debossing configured to form a friction fit with the port connector.

20. The port cage of claim 19, wherein the first and second pluralities of pins include at least one of: a pin that has a barbed edge, a pin that has a different length than another pin in the first and second pluralities of pins, and a pin that is separated from an adjacent pin in the first and second pluralities of pins by a distance that is smaller than a distance separating another pair of adjacent pins in the first and second pluralities of pins.

* * * * *